United States Patent
Paek et al.

(10) Patent No.: US 8,766,679 B1
(45) Date of Patent: Jul. 1, 2014

(54) POWER ON RESET (POR) CIRCUIT

(71) Applicant: Samsung Electro-Mechanics Co., Ltd., Gyeonggi-do (KR)

(72) Inventors: Hyun Paek, Gyeonggi-do (KR); Joo Yul Ko, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/957,382

(22) Filed: Aug. 1, 2013

(30) Foreign Application Priority Data

Dec. 18, 2012 (KR) .................. 10-2012-0148432

(51) Int. Cl.
*H03L 7/00* (2006.01)
(52) U.S. Cl.
USPC .......................................... 327/143
(58) Field of Classification Search
USPC .......................................... 327/143
See application file for complete search history.

(56) References Cited

U.S. PATENT DOCUMENTS

2004/0239413 A1* 12/2004 Gubbins ................ 327/539

FOREIGN PATENT DOCUMENTS

| JP | 2007-228095 A | 9/2007 |
| KR | 10-2006-0101306 A1 | 9/2006 |
| KR | 10-2010-0071603 A | 6/2010 |
| KR | 10-2012-0048982 A | 5/2012 |

* cited by examiner

*Primary Examiner* — Daniel Rojas
(74) *Attorney, Agent, or Firm* — Bracewell & Giuliani LLP; Brad Y. Chin

(57) ABSTRACT

Disclosed herein is a power on reset (POR) circuit, including: a current mirror circuit adjusting ratio of current flowing in a circuit according to voltage supplied from power; an inverter driven according to output of the current mirror circuit to output a POR signal; a brown out detection (BOD) comparator electrically connected to the current mirror circuit and comparing the voltage supplied from the power with reference voltage to output a corresponding voltage signal according to the comparison result; a BOD controlling switch driven when the output of the BOD comparator is zero voltage (0V) to again operate a POR; and a current controlling switch installed in the current mirror circuit and driven when the output of the BOD comparator is zero voltage (0V) to control and supply current of the POR.

10 Claims, 4 Drawing Sheets

- PRIOR ART -

FIG. 2  - PRIOR ART -

POWER ON RESET (POR) CIRCUIT

CROSS REFERENCE(S) TO RELATED APPLICATIONS

This application claims the benefit under 35 U.S.C. Section 119 of Korean Patent Application Serial No. 10-2012-0148432, entitled "Power On Reset (POR) Circuit" filed on Dec. 18, 2012, which is hereby incorporated by reference in its entirety into this application.

BACKGROUND OF THE INVENTION

1. Technical Field

The present invention relates to a power on reset circuit employed in an integrated chip (IC) and the like, and particularly, to a power on reset circuit capable of even being in a circuit requiring a sleep mode or the IC requiring low power consumption.

2. Description of the Related Art

A power on reset (hereinafter, abbreviated as 'POR') circuit is a circuit necessary for an integrated chip (IC) including a digital circuit. A digital block needs a structure in which the digital block is not automatically turned on while power VDD is applied thereto but data stored in the digital block is reset by input of a predetermined pulse. To this end, after the power VDD is applied and a predetermined time is delayed, the input of the pulse is required. However, the POR always needs to consume current. Therefore, it is difficult to use the POR in a circuit requiring a sleep mode or a circuit needed to have small power consumption.

FIG. 1 is a view showing an example of a POR circuit according to the related art.

Referring to FIG. 1, the POR circuit according to related art is configured of a current mirror circuit 110, an inverter 120, and a delay capacitor 130.

When the VDD is applied as the power, current ratio is adjusted by the current mirror circuit 110 so as to mirror current IA to be smaller. In addition, the small IA current charges the delay capacitor and voltage of a "point A" obtains voltage delayed as compared to the VDD. This may obtain more delayed pulse than the VDD through the inverter 120. FIG. 2 is a view showing a simulation result for the POR circuit as described above.

However, in the case of the POR circuit according to related art as described above, since the current mirror circuit 110 always operates, it consumes significantly large power. In addition, since the current mirror circuit 110 always operates as described above, it is difficult to use in the case requiring the sleep mode or in the case of the IC requiring low power.

RELATED ART DOCUMENT

Patent Document (Patent Document 1) Korean Patent Laid-Open Publication No. 10-2010-0071603
(Patent Document 2) Japanese Patent Laid-Open Publication No. 2007-228095

SUMMARY OF THE INVENTION

An object of the present invention is to provide a power on reset (POR) circuit capable of being used even in a circuit requiring a sleep mode or an integrate chip (IC) requiring low power consumption by adding a brown out detection (BOD) circuit to a general POR circuit to implement a POR circuit having small power consumption.

According to an exemplary embodiment of the present invention, there is provided a power on reset (POR) circuit, including: a current mirror circuit adjusting ratio of current flowing in a circuit according to voltage supplied from power; an inverter electrically connected to the current mirror circuit and driven according to output of the current mirror circuit to output a POR signal; a brown out detection (BOD) comparator electrically connected to the current mirror circuit and comparing the voltage supplied from the power with reference voltage to output a corresponding voltage signal according to the comparison result; a BOD controlling switch electrically connected to an output terminal of the BOD comparator and driven when the output of the BOD comparator is zero voltage (0V) to again operate a POR; and a current controlling switch installed in the current mirror circuit and driven when the output of the BOD comparator is zero voltage (0V) to control and supply current of the POR.

The BOD comparator may be configured of an operational amplifier (OP AMP).

The BOD comparator may be configured so that an input terminal of one side thereof is input with reference voltage of bandgap reference (BGR) and an input terminal of the other side thereof is input with voltage from a supplying power VDD.

The BOD comparator may be configured so that the input terminal of the other side is input with the voltage from the supplying power VDD, the voltage from the supplying power VDD being divided by a resistor.

The BOD comparator may be configured so as to output zero voltage (0V) in the case in which the input voltage from the supplying power VDD is lower than the reference voltage of the bandgap reference (BGR).

The BOD comparator may be configured so as to maintain high voltage as output thereof in the case in which the input voltage from the supplying power VDD is the reference voltage or more of the bandgap reference (BGR).

The BOD controlling switch may be configured of a semiconductor switching element.

The semiconductor switching element may be a p-channel type Metal Oxide Semiconductor Field Effect Transistor (MOSFET).

The current controlling switch may be configured of a semiconductor switching element.

The semiconductor switching element may be a p-channel type MOSFET.

DESCRIPTION OF THE PREFERRED EMBODIMENTS

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Through the present specification, unless explicitly described otherwise, "comprising" any components will be understood to imply the inclusion of other components but not the exclusion of any other components. The terms "unit", "module", "device" or the like means a unit processing at least one function or operation, which may be implemented by hardware, software, or combinations of the hardware and the software.

Hereinafter, embodiments of the present invention will be described in detail with reference to the accompanying drawings.

Figure 1:
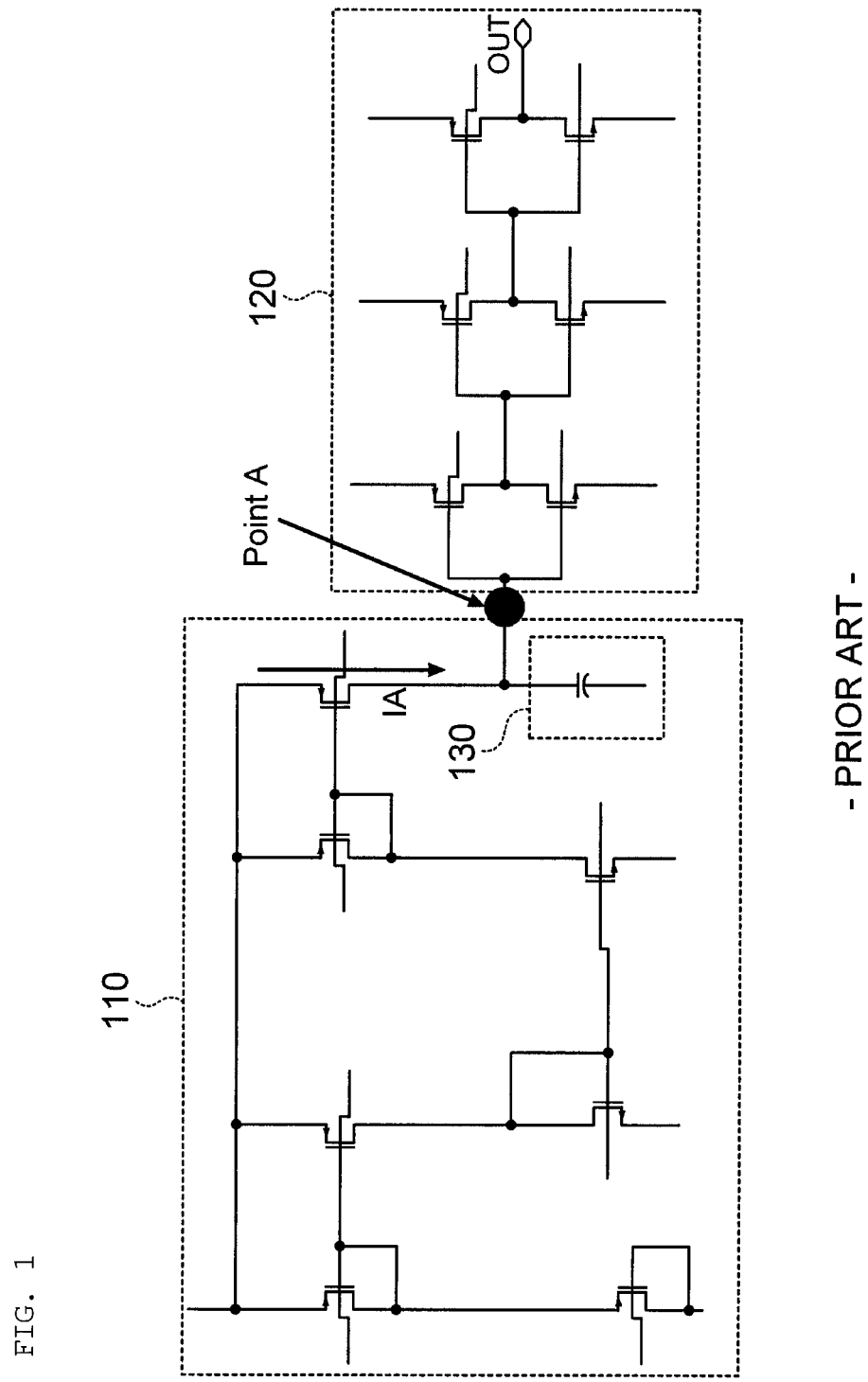
FIG. 1 is a view showing an example of a POR circuit according to the related art.
Figure 2:
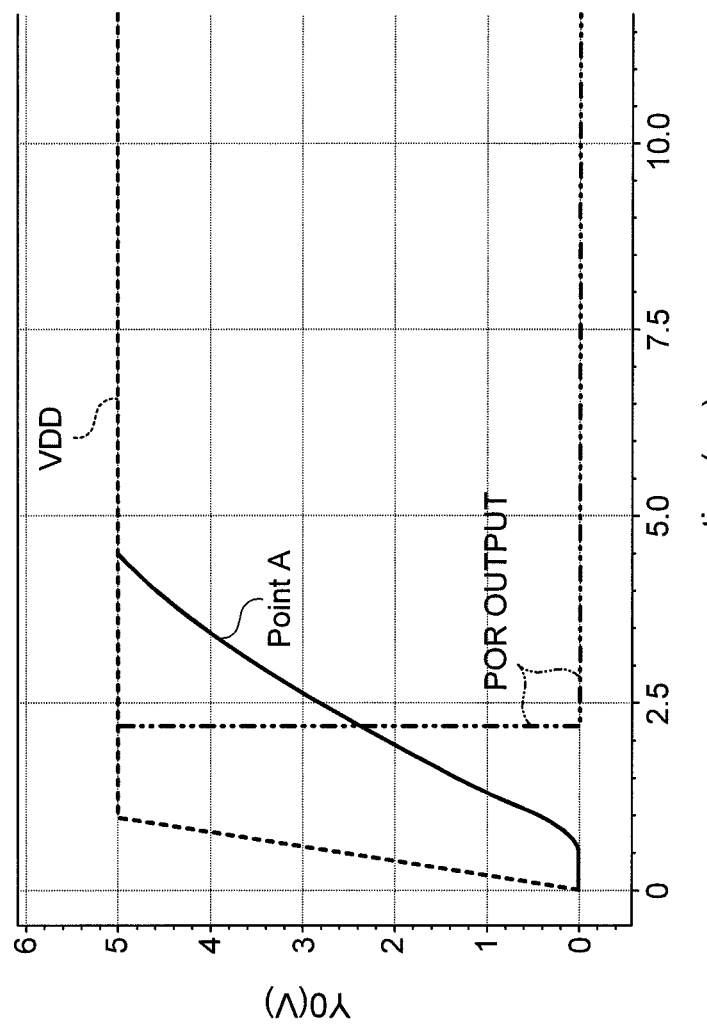
FIG. 2 a view showing a simulation result of current for power VDD and POR output in the POR circuit of FIG. 1.
Figure 3:
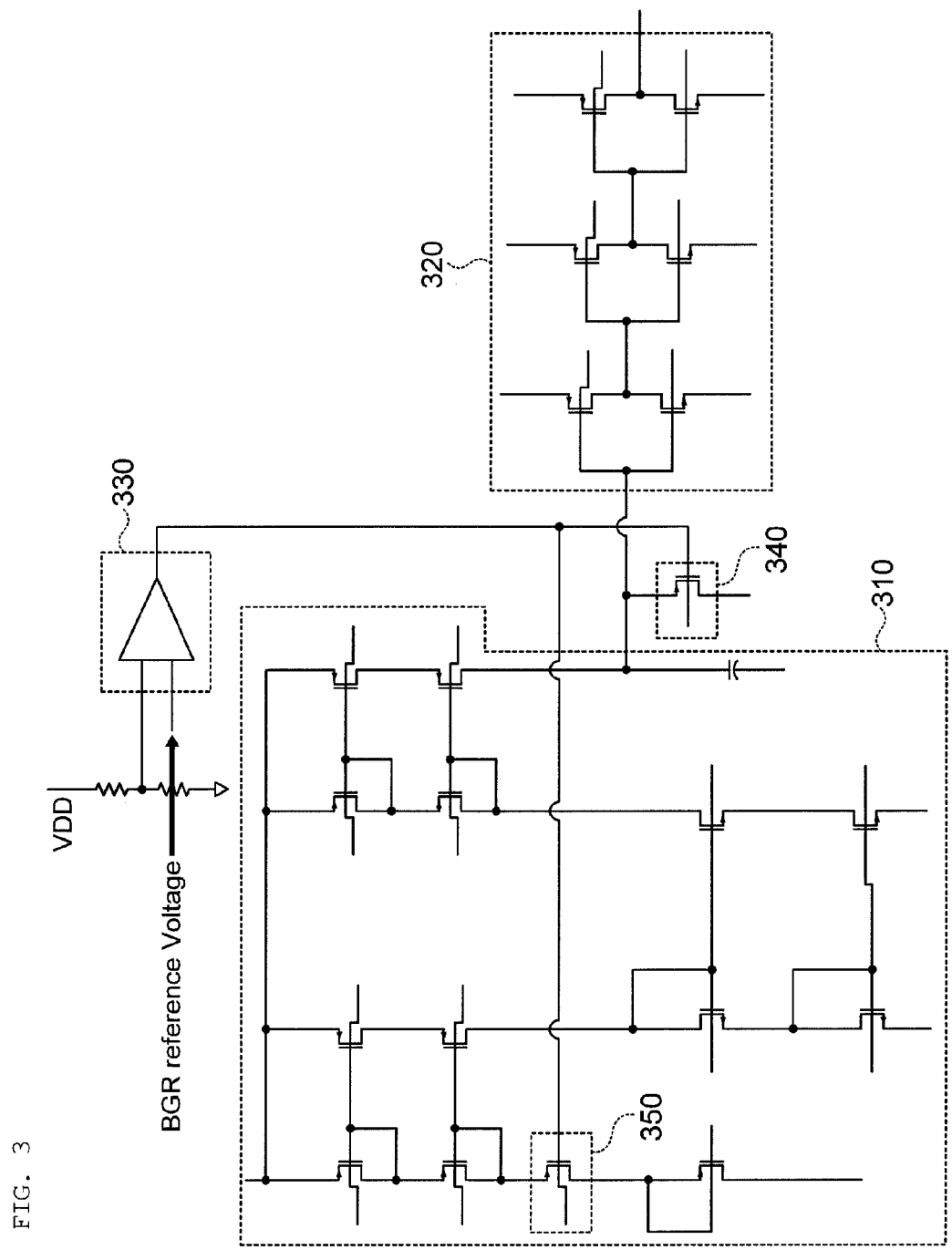
FIG. 3 is a view showing a configuration of a power on reset (POR) circuit according to an exemplary embodiment of the present invention.

FIG. 3 is a view showing a configuration of a power on reset (POR) circuit according to an exemplary embodiment of the present invention.

Referring to FIG. 3, the POR circuit according to the exemplary circuit of the present invention includes a current mirror circuit 310, an inverter 320, a brown out detection (BOD) comparator 330, a BOD controlling switch 340, and a current controlling switch 350.

The current mirror circuit 310 adjusts current ratio flowing in a circuit according to voltage supplied from power VDD.

The inverter 320 is electrically connected to the current mirror circuit 310, and is driven according to output of the current mirror circuit 310 to thereby output a POR signal.

The brown out detection (BOD) comparator 330 is electrically connected to the current mirror circuit 310, and compares supply voltage from the power VDD with reference voltage to thereby output a corresponding voltage signal according to the compared result.

Here, the BOD comparator 330 may be configured of an operational amplifier (OP-AMP).

In addition, the BOD comparator 330 may be configured so that an input terminal of one side thereof is input with reference voltage of bandgap reference BGR and an input terminal of the other side thereof is input with voltage from supplying power VDD.

In this configuration, the BOD comparator 330 may be configured so that the input terminal of the other side thereof is input with the voltage from the supplying power VDD, the voltage from the supplying power VDD being divided (distributed) by a resistor, as shown in FIG. 3.

In addition, the BOD comparator 330 may be configured so as to output zero voltage (0V) in the case in which the input voltage from the supplying power VDD is lower than the reference voltage of the BGR.

In addition, the BOD comparator 330 may be configured so as to maintain high voltage as output thereof in the case in which the input voltage from the supplying power VDD is the reference voltage or more of the BGR.

The BOD controlling switch 340 is electrically connected to an output terminal of the BOD comparator 330 and is driven when output of the BOD comparator 330 is zero voltage (0V) to thereby serve to again operate the POR. Here, the above-mentioned BOD controlling switch 340 may be configured of a semiconductor switching element. In this case, the semiconductor switching element may be configured of a p-channel type Metal Oxide Semiconductor Field Effect Transistor (MOSFET).

The current controlling switch 350 is installed in the current mirror circuit 310 and is driven when the output of the BOD comparator 330 is zero voltage (0V) to thereby serve to control and supply current of the POR. Here, the current controlling switch 350 may be configured of a semiconductor switching element similar to the BOD controlling switch 340. In this case, the semiconductor switching element may also be configured of a p-channel type MOSFET.

Next, operations of a POR circuit having the configuration as described above according the exemplary embodiment of the present invention will be briefly described.

As described above, the POR circuit according to the exemplary embodiment of the present invention is mainly configured of a power on reset circuit part and a brown out detection circuit part. The POR circuit part is a circuit operated when the power is applied and the BOD circuit part is a circuit capable of being forcedly reset when unstable power is input during the operation. The BOD circuit part is configured of the BOD comparator 330 using the operational amplifier (OP AMP) as described above, wherein the input terminal of one side of the BOD comparator 330 is input with the reference voltage of the BGR and the input terminal of the other side thereof is input with the voltage that the VDD is distributed by the resistor.

In the above-mentioned situation, if the VDD is input to the BOD comparator 330 in a state it is lower than the reference voltage of the BGR while fluctuating, the BOD comparator 330 outputs zero voltage (0V) through the output terminal. Therefore, the BOD controlling switch 340 (PMOS) having a gate terminal connected to the output terminal of the BOD comparator 330 is forcedly driven (that is, switched on) to again operate the POR.

In the case in which the VDD voltage is constantly supplied, the BOD comparator 330 is not operated and the output of the BOD comparator 300 is maintained at high voltage. Therefore, the current controlling switch 350 (PMOS) installed in the current mirror circuit 310 is maintained in a switch off state. As a result, current flow in the current mirror circuit 310 is blocked, thereby preventing power consumption during the operation of the current mirror circuit 310. This eventually means that it is possible to design the POR consuming low power using the output of the BOD.

When the VDD voltage that is a predetermined value or less (that is, the reference voltage or less of the BGR) is supplied, 0V is output through the output terminal of the BOD comparator 330. Therefore, the current controlling switch 350 (PMOS) in the current mirror circuit 310 is driven (that is, switched on) to thereby supply current to the current mirror circuit 310.

Figure 4:
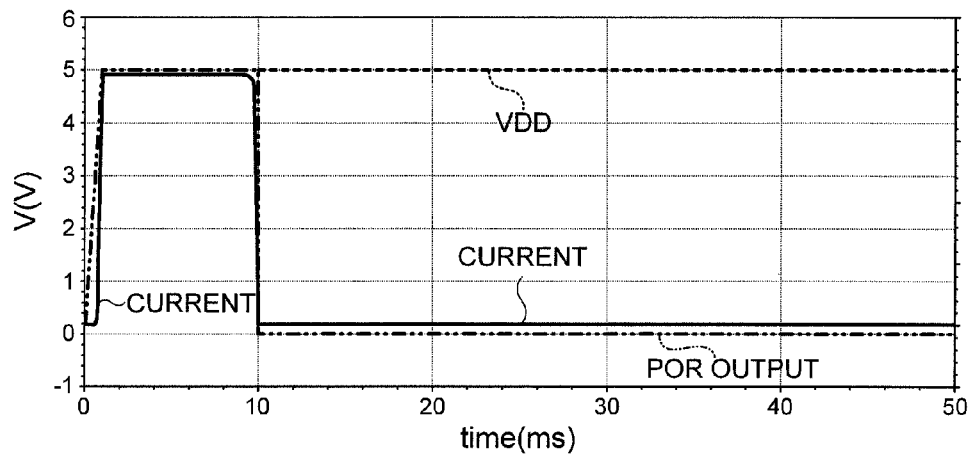
FIG. 4 is a view showing a simulation result of POR output and current when the POR circuit according to the exemplary embodiment of the present invention is constantly supplied with VDD.
Figure 5:
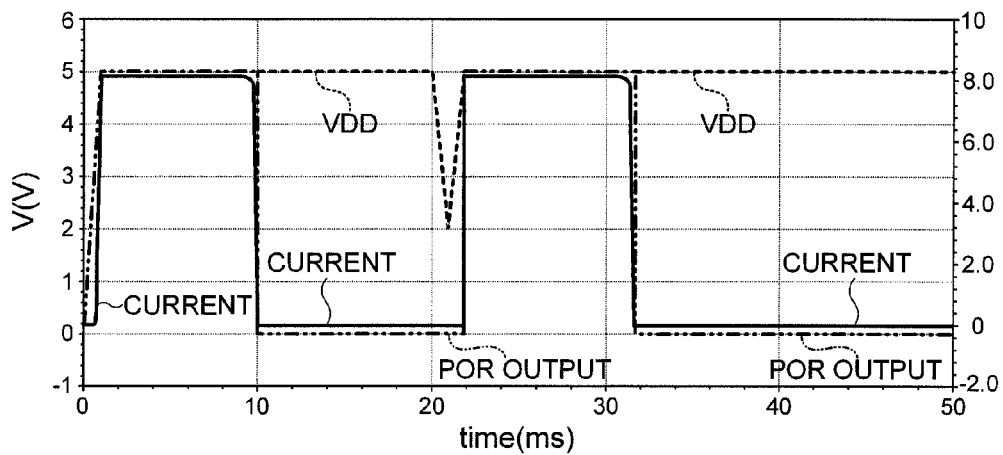
FIG. 5 is a view showing a simulation result of POR output and current when VDD drops to a predetermined value or less in the POR circuit according to the exemplary embodiment of the present invention.

Meanwhile, FIG. 4 is a view showing a simulation result of POR output and current when the POR circuit according to the exemplary embodiment of the present invention is constantly supplied with VDD and FIG. 5 is a view showing a simulation result of POR output and current when VDD drops to a predetermined value or less in the POR circuit according to the exemplary embodiment of the present invention.

As shown in FIG. 4, in the POR circuit according to the exemplary embodiment of the present invention, it may be appreciated that when the VDD is constantly supplied, the output of the BOD comparator 330 is maintained in the high voltage state as described above, such that both the BOD controlling switch 340 and the current controlling switch 350 are maintained in the switch off state and thus current does not flow in the current mirror circuit 310 to thereby represent a current value of 0 and also represent the POR output of 0 value.

However, as shown in FIG. 5, it may be appreciated that when the VDD drops to a predetermined value or less, the BOD comparator 330 outputs 0V as described above, such that both the BOD controlling switch 340 and the current controlling switch 350 are switched on to thereby immediately represent the current value and the POR output having a predetermined magnitude value. Thereafter, it may be appreciated that when the VDD is again constantly supplied, the current value and the POR output also represent 0 value.

Figure 6:
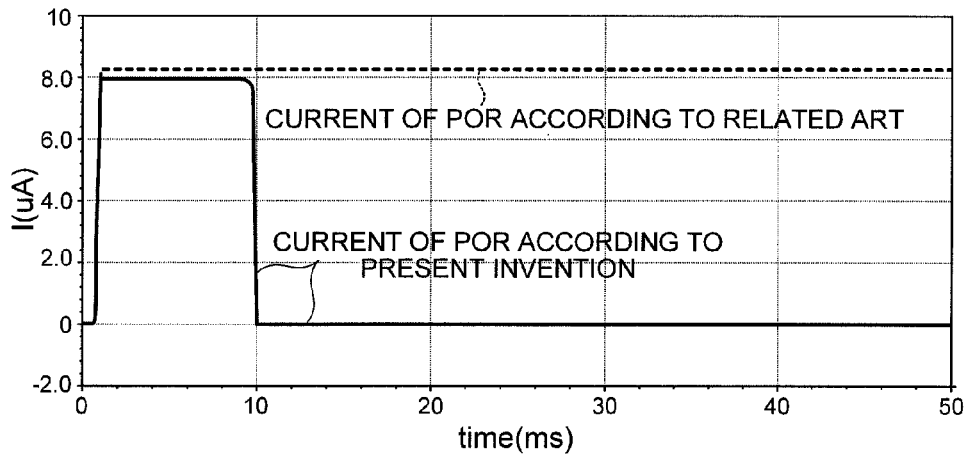
FIG. 6 is a view showing a simulation result of current consumed in the POR circuit according to the related art and the POR circuit according to the exemplary embodiment of the present invention.

In addition, FIG. 6 is a view showing a simulation result of current consumed in the POR circuit according to related art and the POR circuit according to the exemplary embodiment of the present invention.

As shown in FIG. 6, it may be appreciated that the POR circuit according to related art continuously consumes the current having a predetermined magnitude regardless of whether or not the supplying voltage is uniform, but the POR circuit according to the present invention does not consume the current as long as the voltage is uniformly supplied.

According to the exemplary embodiment of the present invention as described above, power consumed in a power on reset (POR) may be minimized by adding a brown out detection (BOD) circuit to a general POR circuit to implement the POR circuit having small power consumption, thereby making it possible to design a low power integrated chip (IC).

Although the preferred embodiments of the present invention have been disclosed, the present invention is not limited thereto, but those skilled in the art will appreciated that various modifications, additions, and substitutions are possible, without departing from the scope and sprit of the invention as disclosed in the accompanying claims. Therefore, the true scope of the present invention should be construed by the following claims, and all of the technical spirit of the present invention within the equivalent range thereof are included in scope of the present invention.

What is claimed is:

1. A power on reset (POR) circuit, comprising:
   a current mirror circuit adjusting ratio of current flowing in a circuit according to voltage supplied from power;
   an inverter electrically connected to the current mirror circuit and driven according to output of the current mirror circuit to output a POR signal;
   a brown out detection (BOD) comparator electrically connected to the current mirror circuit and comparing the voltage supplied from the power with reference voltage to output a corresponding voltage signal according to the comparison result;
   a BOD controlling switch electrically connected to an output terminal of the BOD comparator and driven when the output of the BOD comparator is zero voltage (0V) to again operate a POR; and
   a current controlling switch installed in the current mirror circuit and driven when the output of the BOD comparator is zero voltage (0V) to control and supply current of the POR.

2. The POR circuit according to claim 1, wherein the BOD comparator is configured of an operational amplifier (OP AMP).

3. The POR circuit according to claim 1, wherein the BOD comparator is configured so that an input terminal of one side thereof is input with reference voltage of bandgap reference (BGR) and an input terminal of the other side thereof is input with voltage from a supplying power VDD.

4. The POR circuit according to claim 3, wherein the BOD comparator is configured so that the input terminal of the other side is input with the voltage from the supplying power VDD, the voltage from the supplying power VDD being divided by a resistor.

5. The POR circuit according to claim 3, wherein the BOD comparator is configured so as to output zero voltage (0V) in the case in which the input voltage from the supplying power VDD is lower than the reference voltage of the bandgap reference (BGR).

6. The POR circuit according to claim 3, wherein the BOD comparator is configured so as to maintain high voltage as output thereof in the case in which the input voltage from the supplying power VDD is the reference voltage or more of the bandgap reference (BGR).

7. The POR circuit according to claim 1, wherein the BOD controlling switch is configured of a semiconductor switching element.

8. The POR circuit according to claim 7, wherein the semiconductor switching element is a p-channel type Metal Oxide Semiconductor Field Effect Transistor (MOSFET).

9. The POR circuit according to claim 1, wherein the current controlling switch is configured of a semiconductor switching element.

10. The POR circuit according to claim 9, wherein the semiconductor switching element is a p-channel type MOSFET.

* * * * *